(12) United States Patent
Lim et al.

(10) Patent No.: US 11,121,306 B2
(45) Date of Patent: Sep. 14, 2021

(54) MAGNETIC TUNNEL JUNCTION DEVICE WITH MAGNETIC LAYER OF EASY-CONE STATE

(71) Applicant: KOREA UNIVERSITY RESEARCH AND BUSINESS FOUNDATION, Seoul (KR)

(72) Inventors: Sang Ho Lim, Namyangju-si (KR); Hyung-Keun Gweon, Seoul (KR); Seong Rae Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 65 days.

(21) Appl. No.: 16/235,102

(22) Filed: Dec. 28, 2018

(65) Prior Publication Data

US 2019/0140164 A1 May 9, 2019

Related U.S. Application Data

(63) Continuation of application No. PCT/KR2018/006893, filed on Jun. 19, 2018.

(30) Foreign Application Priority Data

Jun. 20, 2017 (KR) .......................... 10-2017-0078034

(51) Int. Cl.
*H01L 43/02* (2006.01)
*H01L 43/10* (2006.01)
(Continued)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
CPC .......... H01L 43/08; H01L 43/02; H01L 43/10; H01L 43/12
See application file for complete search history.

(56) References Cited

U.S. PATENT DOCUMENTS

2014/0001586 A1* 1/2014 Shen ...................... H01L 43/08
257/421
2016/0359103 A1* 12/2016 Fermon .................. H01L 43/08
(Continued)

FOREIGN PATENT DOCUMENTS

KR 10-2014-0091481 A 7/2014
KR 10-2015-0077348 A 7/2015
(Continued)

OTHER PUBLICATIONS

International Search Report dated Oct. 1, 2018, in parent International Patent Application No. PCT/KR2018/006893 (3 pages in English and 4 pages in Korean).
(Continued)

*Primary Examiner* — Vongsavanh Sengdara
(74) *Attorney, Agent, or Firm* — NSIP Law (57) ABSTRACT

Provided are a magnetic tunnel junction device and a method of fabricating the same. The magnetic tunnel junction device includes a heavy metal layer, a free magnetic layer disposed on the heavy metal layer, and a tunnel insulating layer disposed on the free magnetic layer. The heavy metal layer includes platinum (Pt), the free magnetic layer includes cobalt (Co), a magnetization state of the free magnetic layer has an easy-cone state, the free magnetic layer has a positive first-order perpendicular magnetic anisotropy constant and a negative second-order perpendicular magnetic anisotropy constant, and the tunnel insulating layer includes magnesium oxide (MgO).

6 Claims, 11 Drawing Sheets

(51) Int. Cl.
*H01L 43/12* (2006.01)
*H01L 43/08* (2006.01)

(56) References Cited

U.S. PATENT DOCUMENTS

2018/0123025 A1* 5/2018 Lee ................... H01F 10/3272
2018/0151214 A1* 5/2018 Matsumoto ........... G11C 11/161

FOREIGN PATENT DOCUMENTS

| KR | 10-2016-0112890 A | 9/2016 |
| KR | 10-2017-0001739 A | 1/2017 |
| KR | 10-1738828 B1 | 5/2017 |

OTHER PUBLICATIONS

Written Opinion of the International Searching Authority dated Oct. 1, 2018, in parent International Patent Application No. PCT/KR2018/006893 (5 pages in Korean).
Written Opinion of the International Searching Authority dated Oct. 1, 2018, in parent International Patent Application No. PCT/KR2018/006893 (6 pages in English and 5 pages in Korean).

* cited by examiner

MAGNETIC TUNNEL JUNCTION DEVICE WITH MAGNETIC LAYER OF EASY-CONE STATE

CROSS-REFERENCE TO RELATED APPLICATIONS

This application is a continuation of International Application No. PCT/KR2018/006893 filed on Jun. 19, 2018, which claims the benefit under 35 USC 365(b) of Korean Patent Application No. 10-2017-0078034 filed on Jun. 20, 2017, the entire disclosures of which are incorporated herein by reference for all purposes.

BACKGROUND

1. Field

The present disclosure relates to a magnetic tunnel junction device and, more particularly, to a magnetic tunnel junction device including a magnetic layer of an easy-cone state.

2. Description of Related Art

Perpendicular magnetic anisotropy (PMA) is a very important characteristic directly related to high-thermal stability characteristics, which are important for high integration of a magnetic memory (MRAM) and data retention. PMA may be exhibited by bulk unique characteristics or an interface of a thin film. Up to the present, researches into PMA have been conducted in various materials such as rare-earth 3d transition metal amorphous alloys, multilayer thin films such as CoPd, CoPt, and the like, and intermetallic compounds such as FePt and CoPt each having an L10 structure. However, the rare-earth 3d transition metal amorphous alloys and the CoPt (Pd) multilayer thin films do not have sufficient PMA energy density and degrade in PMA characteristics at a relatively low post-annealing temperature. Therefore, the rare-earth 3d transition metal amorphous alloys and the CoPt (Pd) multilayer thin films are not appropriate for application of devices. Meanwhile, the intermetallic compounds such as FePt and CoPt, each having an L10 structure, have been spotlighted due to high PMA energy density and improved post-annealing stability. However, the intermetallic compounds such as FePt and CoPt is also not appropriate for a process of fabricating a magnetic memory because a significantly high process temperature condition of 600° C. or more is required to establish a high long-distance degree of order of the intermetallic compound. Accordingly, a tri-layer thin film of heavy metal layer/magnetic layer/insulating layer based on a Co or CoFeB alloy has been widely used because the tri-layer thin film is easy to be manufactured and has improved post-annealing stability and a significantly high level of PMA energy density.

Perpendicular magnetic anisotropy (PMA) of a tri-layer thin film at the nanometer level, which is mainly used in magnetic memory application, is generally known to have a significant contribution due to interfacial characteristics. Accordingly, characteristics of the PMA of the tri-layer thin film are determined by an interfacial state thereof. In a tri-layer thin film of heavy metal layer/magnetic layer/insulating layer, PMA energy density may be significantly reduced due to interfacial roughness or oxidation of the magnetic layer which occurs during a sputtering process.

In the tri-layer thin film of heavy metal layer/magnetic layer/insulating layer, PMA may also be described as the sum of two components. The PMA includes a first-order PMA and a second-order PMA. According to a sign and a relative size of two energies, an easy axis of a magnetic thin film may have an in-plane direction, an out-of-plane direction, and an easy-cone direction between the in-plane direction and the out-of-plane direction, and a coexistence state in which the in-plane direction and the out-of-plane direction coexist. An easy-magnetization direction may be controlled by adjusting an interfacial state and a thickness of a magnetic layer.

SUMMARY

Example embodiments of the present disclosure provide a tri-layer thin film of heavy metal layer/magnetic layer/insulating layer, which maintains high PMA energy density and its characteristics without structural collapse at high-temperature post annealing, to implement a magnetic tunnel junction including a magnetic layer of an easy-cone state.

Example embodiments of the present disclosure provide a method of fabricating a tri-layer thin film of heavy metal layer/magnetic layer/insulating layer to implement a magnetic tunnel junction including a magnetic layer of an easy-cone state.

An aspect of the present disclosure provide a magnetic tunnel junction device including a heavy metal layer, a free magnetic layer disposed on the heavy metal layer, and a tunnel insulating layer disposed on the free magnetic layer. The heavy metal layer includes platinum (Pt), the free magnetic layer includes cobalt (Co), a magnetization state of the free magnetic layer has an easy-cone state, the free magnetic layer has a positive first-order perpendicular magnetic anisotropy constant and a negative second-order perpendicular magnetic anisotropy constant, and the tunnel insulating layer includes magnesium oxide (MgO).

In an example embodiment, the free magnetic layer may have a thickness of 1.4 nanometers to 1.8 nanometers, a magnetization of the free magnetic layer may be aligned in an in-plane direction at the same as deposition, and the magnetization of the free magnetic layer may be aligned in an easy-cone state by annealing.

Another aspect of the present disclosure provides a method of fabricating a magnetic tunnel junction device including a heavy metal layer, a free magnetic layer disposed on the heavy metal layer, and a tunnel insulating layer disposed on the free magnetic layer. The method includes sequentially depositing the seed layer, the heavy metal layer, and the free magnetic layer using DC sputtering, and depositing a tunnel insulating layer on the free magnetic layer using RF sputtering to prepare a plurality of sample according to a thickness of the free magnetic layer, measuring a first-order perpendicular magnetic anisotropy constant and a second-order perpendicular magnetic anisotropy constant of each of the sample according to the thickness of the free magnetic layer, and conforming whether the samples satisfy an easy-cone state, increasing a post-annealing temperature or increasing RF sputtering power of the tunnel insulating layer, when the samples do not satisfy the easy-cone state, to prepare samples again, and selecting the thickness of the free magnetic layer, the post-annealing temperature, and the RF sputtering power satisfying the conditions, when the samples satisfy the easy-cone state, to fabricate a magnetic tunnel junction device.

In an example embodiment, the post-annealing temperature may range from 275° C. to 400° C.

In an example embodiment, RF sputtering power for depositing the tunnel insulating layer may be 1.10 W/cm² or more.

In an example embodiment, the free magnetic layer may have a thickness of 1.4 nanometers to 1.8 nanometers.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

A magnetic tunnel junction according to an example embodiment of the present disclosure may be applied to a spin transfer torque MRAM (STT-MRAM). Specifically, the magnetic tunnel junction includes a heavy metal layer, a free magnetic layer disposed on the heavy metal layer, a tunnel insulating layer disposed on the free magnetic layer, and a pinned magnetic layer disposed on the tunnel insulating layer. The free magnetic layer has an easy-cone state. The pinned magnetic layer may be perpendicularly magnetized, and the free magnetic layer may have a polar angle $\theta_E$ and may have an easy-cone state. Accordingly, an incubation time dominating a switching time tsw of the STT-MRAM may be effectively reduced. As a result, switching current density Jsw may be decreased.

Due to the polar angle of the free magnetic layer in the cone state, tunneling magnetoresistance (TMR) may be decreased to reduce read-out efficiency. However, there is a relationship $\Delta TMR \propto \cos \theta$, where $\theta$ is an angle of magnetization vector between the fixed magnetic layer and the free magnetic layer. When $\theta_E \leq 20$ degrees, $\Delta TMR$ is slightly decreased. In the case in which the free magnetic layer has a cone state, thermal stability $\Delta$ of the STT-MRAM is maintained at an existing level, while the switching current density Jsw may decrease by 22% and the switching time tsw may decrease by 56%. However, such characteristic improvement provides a decrease in TMR of only 8%. Accordingly, there is need for a structure and a method of providing a cone state to the free magnetic layer while having a vertically magnetized state.

According to an example embodiment, we investigated conditions for providing an easy-cone state to a free-magnetic layer. The free magnetic layer has a positive first-order perpendicular magnetic anisotropy constant $K_{1eff}$ and a negative second-order perpendicular magnetic anisotropy constant $K_2$. In detail, the second perpendicular magnetic anisotropy constant $K_2$ of the free magnetic layer should satisfy a condition of $K_2 < -½ K_{1eff}$. The condition is satisfied in a specific post-annealing condition and a thickness of the free magnetic layer.

Example embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Reference numerals are indicated in detail in example embodiments of the present disclosure, and their examples are represented in reference drawings. In every possible case, like reference numerals are used for referring to the same or similar elements in the description and drawings.

Figure 1:
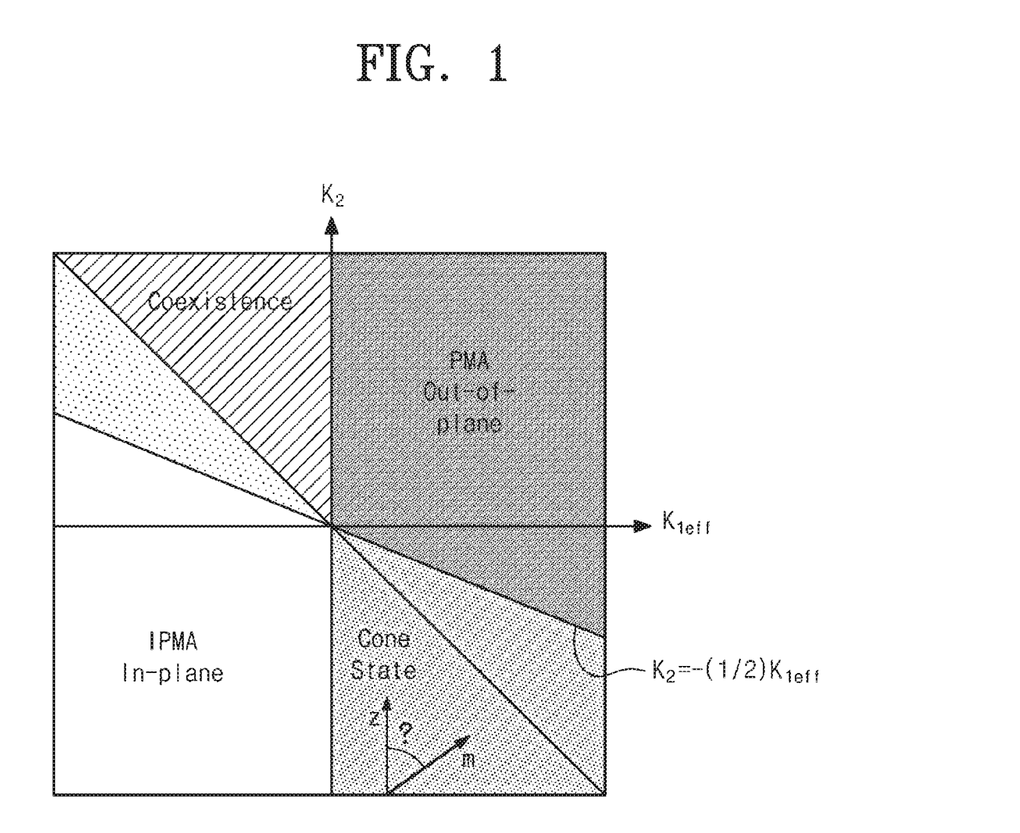
FIG. 1 is a phase diagram of a magnetic layer shown on coordinates of a first-order perpendicular anisotropy constant and a second-order anisotropy constant.

FIG. 1 is a phase diagram of a magnetic layer shown on coordinates of a first-order perpendicular anisotropy constant and a second-order anisotropy constant.

Referring to FIG. 1, a magnetic thin film includes a first-order PMA $K_{1eff}$ and a second-order PMA $K_2$. Depending on relative sizes of $K_{1eff}$ and $K_2$, an easy axis of the magnetic thin film may have an in-plane state, an out-of-plane state, an easy-cone state between the in-plane state and the out-of-plane state, and a coexistence state in which the in-plane state and the out-of-plane state coexist. An easy magnetization direction may be controlled by adjusting an interfacial state and a thickness of the magnetic layer.

Figure 2:
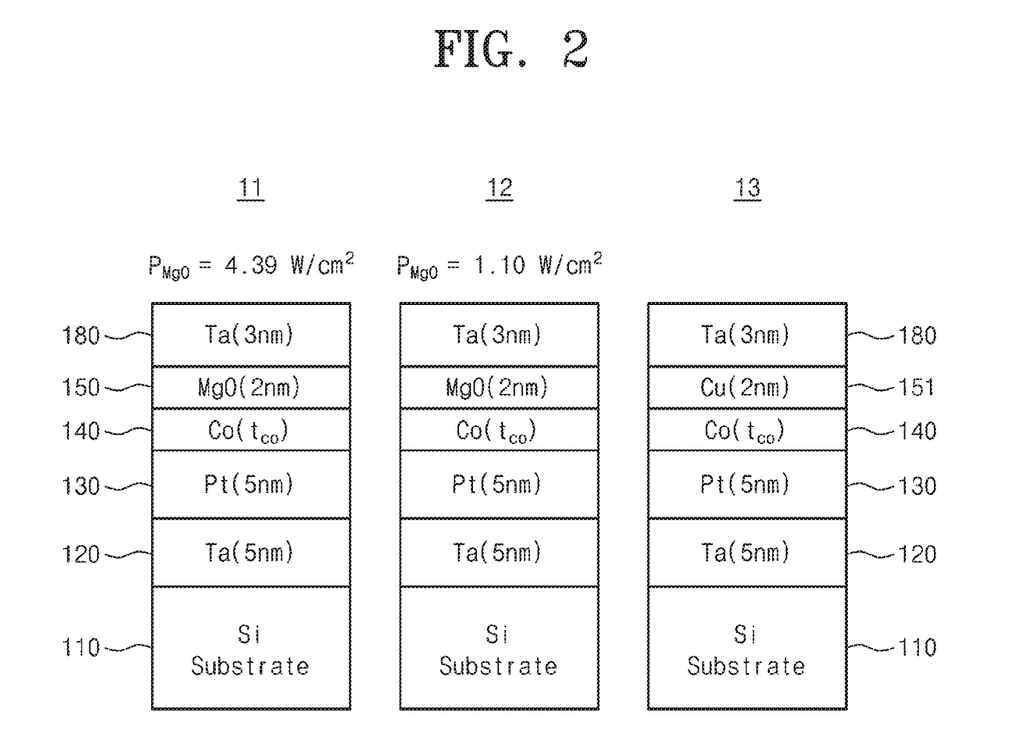
FIG. 2 includes cross-sectional views illustrating structures of samples according to an example embodiment of the present disclosure.

FIG. 2 includes cross-sectional views illustrating structures of samples according to an example embodiment of the present disclosure.

Referring to FIG. 2, a first sample 11 has a structure of Si substrate/Ta (5 nm)/Pt (5 nm)/Co ($t_{Co}$)/MgO (2 nm)/Ta (3 nm). A cobalt magnetic layer has a thickness $t_{Co}$ of 0.6 nm to 2.0 nm. Ta (5 nm)/Pt (5 nm)/Co ($t_{Co}$) are sequentially deposited using DC sputtering. MgO (2 nm) is deposited using RF sputtering, and RF sputtering power is 4.39 W/cm².

A second sample 12 has a structure of Si substrate/Ta (5 nm)/Pt (5 nm)/Co ($t_{Co}$)/MgO (2 nm)/Ta (3 nm). A cobalt magnetic layer has a thickness $t_{Co}$ of 0.6 nm to 2.0 nm. Ta (5 nm)/Pt (5 nm)/Co ($t_{Co}$) are sequentially deposited using DC sputtering. MgO (2 nm) is deposited using RF sputtering, and RF sputtering power is 1.109 W/cm².

A third sample 13 has a structure of Si substrate/Ta (5 nm)/Pt (5 nm)/Co ($t_{Co}$)/Cu (2 nm)/Ta (3 nm). A cobalt magnetic layer has a thickness $t_{Co}$ of 1 nm to 2.0 nm. Ta (5 nm)/Pt (5 nm)/Co ($t_{Co}$)/Cu (2 nm)/Ta (3 nm) are sequentially deposited using DC sputtering.

A silicon (Si) substrate 110 is a substrate of wet-oxidation Si—SiO₂. After a seed layer 120 of Ta (5.0 nm) is formed on the Si substrate, a heavy metal layer 130 of Pt (5.0 nm) is formed. A thickness ($t_{Co}$) of the magnetic layer 140 was changed on the heavy metal layer. A tunnel insulating layer 150 was disposed on the free magnetic layer 140, and MgO was used as the tunnel insulating layer. The tunnel insulating layer was deposited according to RF sputtering power variation ($P_{MgO}$). A protective layer 180 of Ta (3.0 nm) is formed thereon to prevent additional oxidation.

Each layer was deposited using a magnetron sputtering deposition method. A base pressure of a chamber was $5 \times 10^{-8}$ Torr, and the deposition was performed at 1 or $2 \times 10^{-3}$ Torr using argon (Ar) gas injection. During the deposition, all layers were formed in-situ without breaking vacuum and each layer was deposited with a single target (Ta, Pt, Co, or MgO).

The seed layer 120 may contain tantalum (Ta), tantalum-ruthenium (Ta—Ru), tantalum-platinum-ruthenium (Ta—Pt—Ru) or the like, and may include a single layer or multiple layers capable of controlling interfacial roughness. The interfacial roughness may be significantly reduced at an optimum thickness of tantalum (Ta).

A free magnetic layer 140 may include iron (Fe), which is a single material, or CoFeB, which is an alloy, in addition to cobalt (Co). The free magnetic layer 140 has a first-order perpendicular magnetic anisotropy constant $K_{1\mathit{eff}}$ and a second-order perpendicular magnetic anisotropy constant $K_2$. Magnetic anisotropy may be controlled by adjusting a thickness of a magnetic layer.

A tunnel insulating layer 150 may include an insulating layer such as MgO, $AlO_x$, $GdO_x$, or the like. The amount of oxygen interpenetrating a magnetic layer or a heavy metal layer may be controlled according to sputtering power applied while the tunnel insulating layer is deposited. Since a thickness of the tunnel insulating layer is also proportional to the amount of the oxygen interpenetration, it may also be controlled in the same manner. The interfacial roughness may be controlled by adjusting the sputtering power of the insulating layer.

Second-order perpendicular magnetic anisotropy energy density may be adjusted by adjusting roughness of an interface between the heavy metal layer and the magnetic layer or roughness of an interface between the magnetic layer and the insulating layer. In addition, the interfacial roughness may be adjusted by adjusting post-annealing process conditions.

The amount of the oxygen interpenetrating the magnetic layer may be suppressed by reducing the sputtering power or thickness of MgO. When the sputtering power of MgO is increased, the second-order perpendicular anisotropy constant is increased to a negative value. Back diffusion of the interpenetrated oxygen is induced by high-temperature annealing, and the second-order perpendicular anisotropy constant is increased to a negative value.

A thickness of a thin film was adjusted by precisely controlling time from a deposition rate. A thickness of the deposited thin film was precisely measured using a surface profiler to precisely measure a deposition rate of the thin film. An X-ray photoelectron spectroscopy (XPS) was used to estimate the oxidation amount of a prepared sample. In addition, a vibrating sample magnetometer (VSM) and a superconducting quantum interference device (SQUID) were used to analyze magnetic characteristics.

Figure 3:
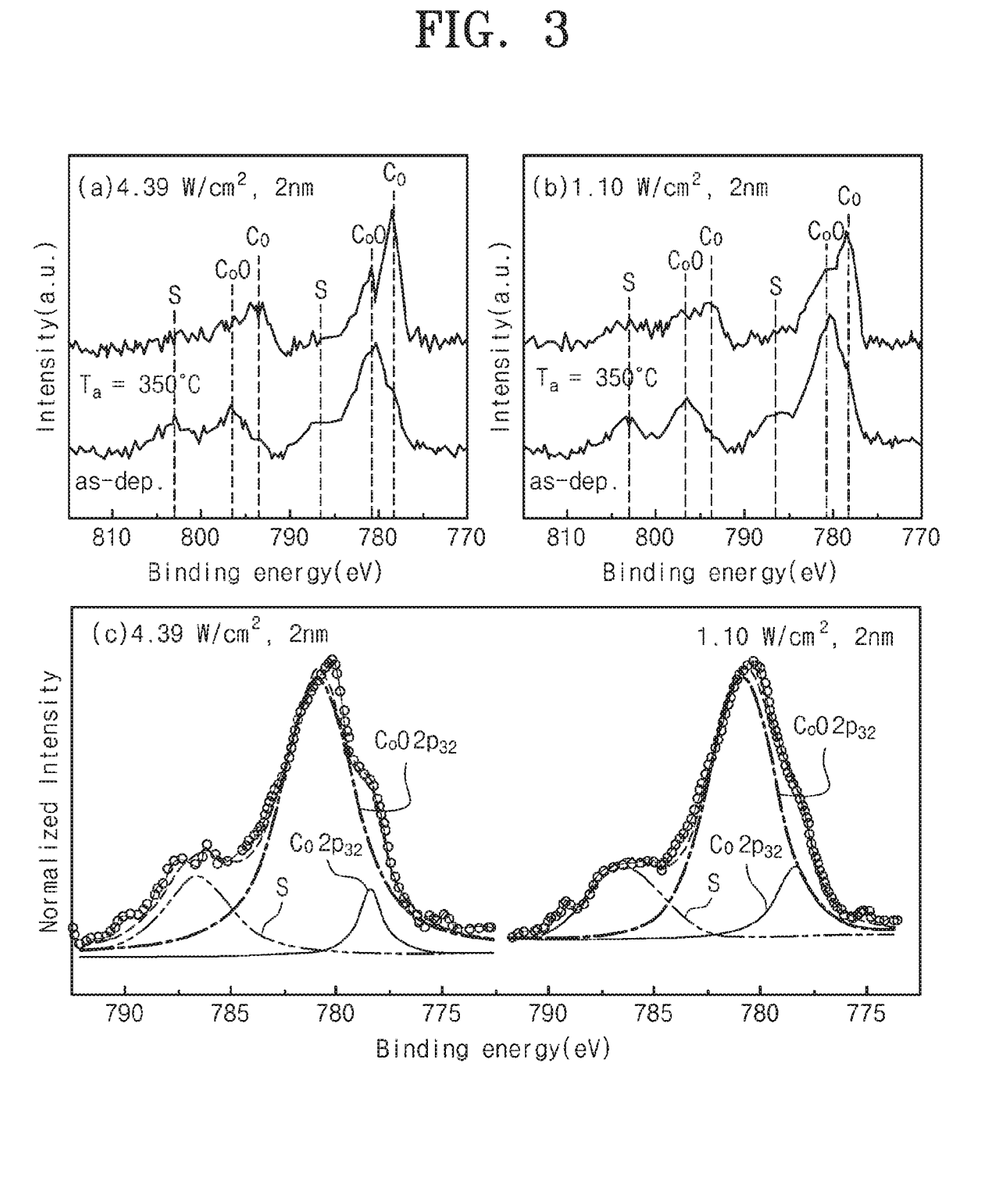
FIG. 3 illustrates an X-ray photoelectron spectroscopy spectrum for Pt/Co (0.6 nm)/MgO (2.0 nm), which is a tri-layer structure, according to an example embodiment of the present disclosure.

FIG. 3 illustrates an X-ray photoelectron spectroscopy spectrum for Pt/Co (0.6 nm)/MgO (2.0 nm), which is a tri-layer structure, according to an example embodiment of the present disclosure.

Referring to FIG. 3, (a) and (b) illustrate a tri-layer thin film of a first sample 11 and a second sample 12 stacked under a condition in which $P_{MgO}$=4.39 W/cm² and 1.10 W/cm², respectively, and (c) is an enlarged view of a $2_{p3/2}$ spectral region before annealing a corresponding sample. The amount of cobalt (Co) oxidized may be estimated through fitting. According to the estimated amount, the content of a cobalt (Co) oxide was 91.9% in the case in which $P_{MgO}$=4.39 W/cm² and the content of a cobalt (Co) oxide was 83.9% in the case in which $P_{MgO}$=1.10 W/cm². The oxidation of Co may be suppressed when sputtering power is reduced.

Figure 4:
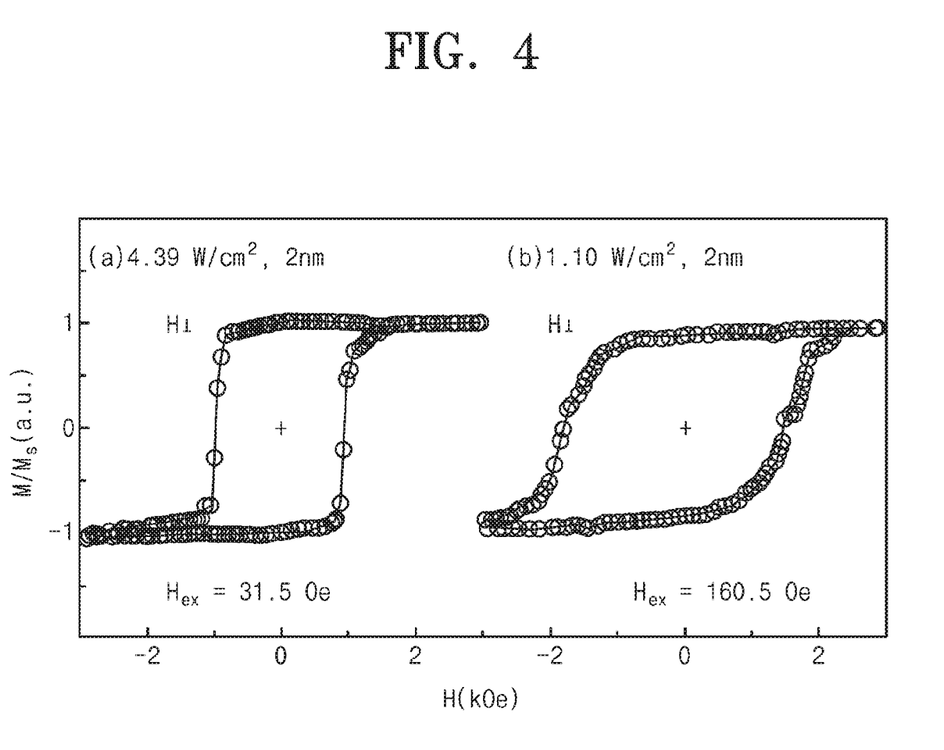
FIG. 4 illustrates a normalized magnetization value (M/Ms)-applied magnetic field (H) hysteresis curve for Pt/Co (0.6 nm)/MgO (2.0 nm), which is a tri-layer structure, according to an example embodiment of the present disclosure.

FIG. 4 illustrates a normalized magnetization value (M/Ms)-applied magnetic field (H) hysteresis curve for Pt/Co (0.6 nm)/MgO (2.0 nm), which is a tri-layer structure, according to an example embodiment of the present disclosure.

Referring to FIG. 4, a measurement temperature is 100 K. If a cobalt (Co) oxide is formed to have a considerable thickness, an exchange bias may be applied to the magnetic layer 140. The hysteresis curve is biased in a direction of a negative applied magnetic field. It can be seen that a considerable amount of the cobalt (Co) oxide is formed as a thickness of the MgO tunnel insulating layer is increased to about 2.0 nm.

Figure 5:
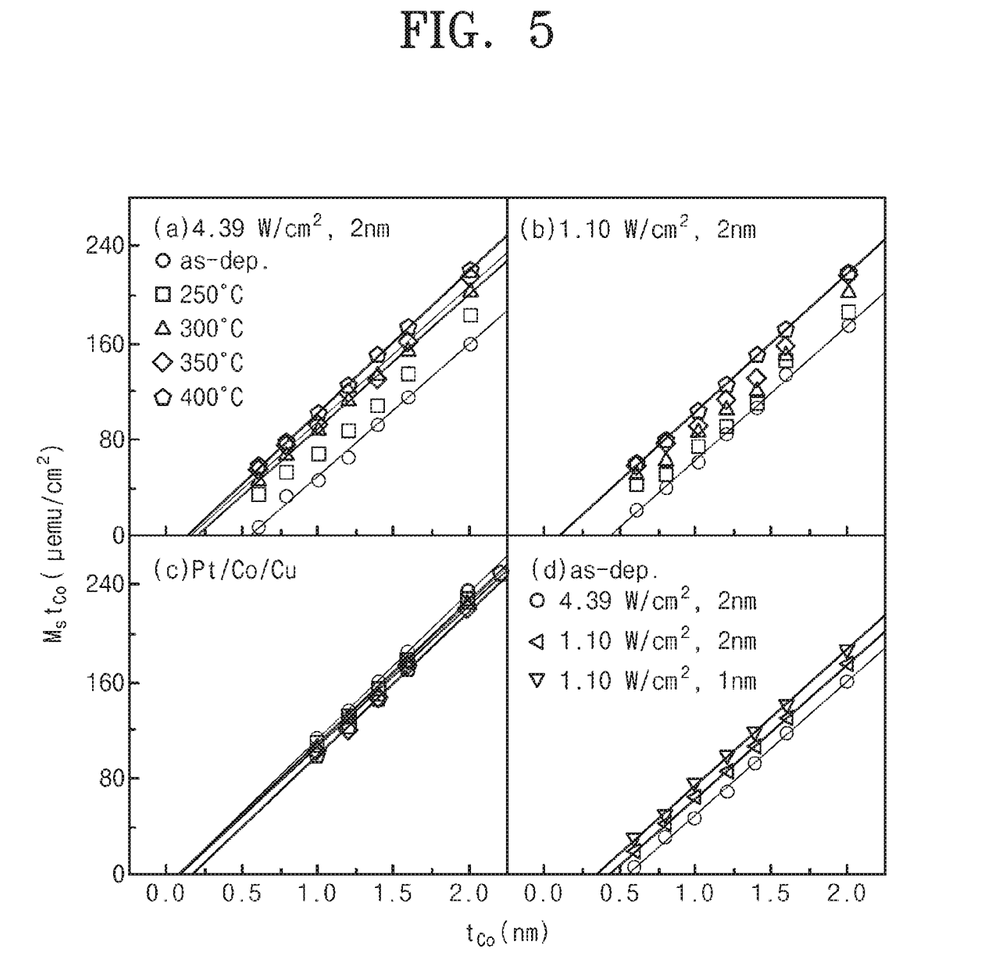
FIG. 5 illustrates a $M_s t_{Co}$-$t_{Co}$ graph for Pt/Co($t_{Co}$)/MgO ($P_{MgO}$, $t_{MgO}$), which is a tri-layer structure, according to an example embodiment of the present disclosure.

FIG. 5 illustrates a $M_s t_{Co}$-$t_{Co}$ graph for Pt/Co($t_{Co}$)/MgO ($P_{MgO}$,$t_{MgO}$), which is a tri-layer structure, according to an example embodiment of the present disclosure.

Referring to FIG. 5, a value of a magnetic dead layer (MDL) may be derived through an x-intercept. An average saturation magnetization (Ms) value of the entire sample may be obtained through a slope. It can be observed that an MDL value is significantly decreased as sputtering power and thickness of MgO are reduced, that is, the amount of oxygen interpenetration is reduced. As an example, it can be seen that a difference between an MDL value when $P_{MgO}$=4.39 W/cm² and $t_{MgO}$=2.0 nm and an MDL value when $P_{MgO}$=1.10 W/cm² and $t_{MgO}$=2.0 nm is about 0.2 nm, before being annealed. Similarly, it can be seen that in (a) and (b), the MDL value is gradually decreased by back diffusion of the interpenetrated oxygen when annealing is performed.

Figure 6:
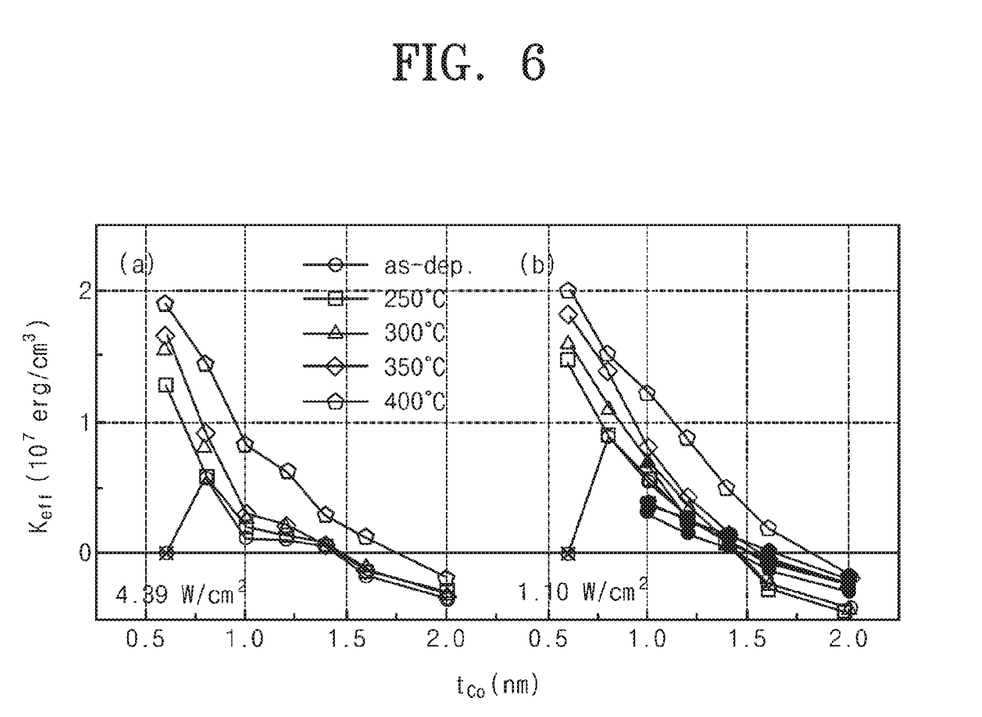
FIG. 6 illustrates a graph of PMA energy density $K_{eff}$ depending on $t_{Co}$ for Pt/Co($t_{Co}$)/MgO($P_{MgO}$, $t_{MgO}$), which is a tri-layer structure, according to an example embodiment of the present disclosure.

FIG. 6 illustrates a graph a PMA energy density $K_{\mathit{eff}}$ depending on $t_{Co}$ for Pt/Co($t_{Co}$)/MgO($P_{MgO}$,$t_{MgO}$), which is a tri-layer structure, according to an example embodiment of the present disclosure.

Referring to FIG. 6, it can be seen that PMA energy density $K_{\mathit{eff}}$ was further improved (a) when sputtering power of MgO was reduced as compared to a case in which $P_{MgO}$=4.39 W/cm² and $t_{MgO}$=2.0 nm, and (b) in a case in which $P_{MgO}$=1.10 W/cm² and $t_{MgO}$=2.0 nm. In each case, observed maximum PMA energy density ($K_{\mathit{eff}}$) values were 1.88×10⁷ and 1.99×10⁷ erg/cm³, respectively. These values are much higher than values observed in a tri-layer thin film according to a related art.

Figure 7:
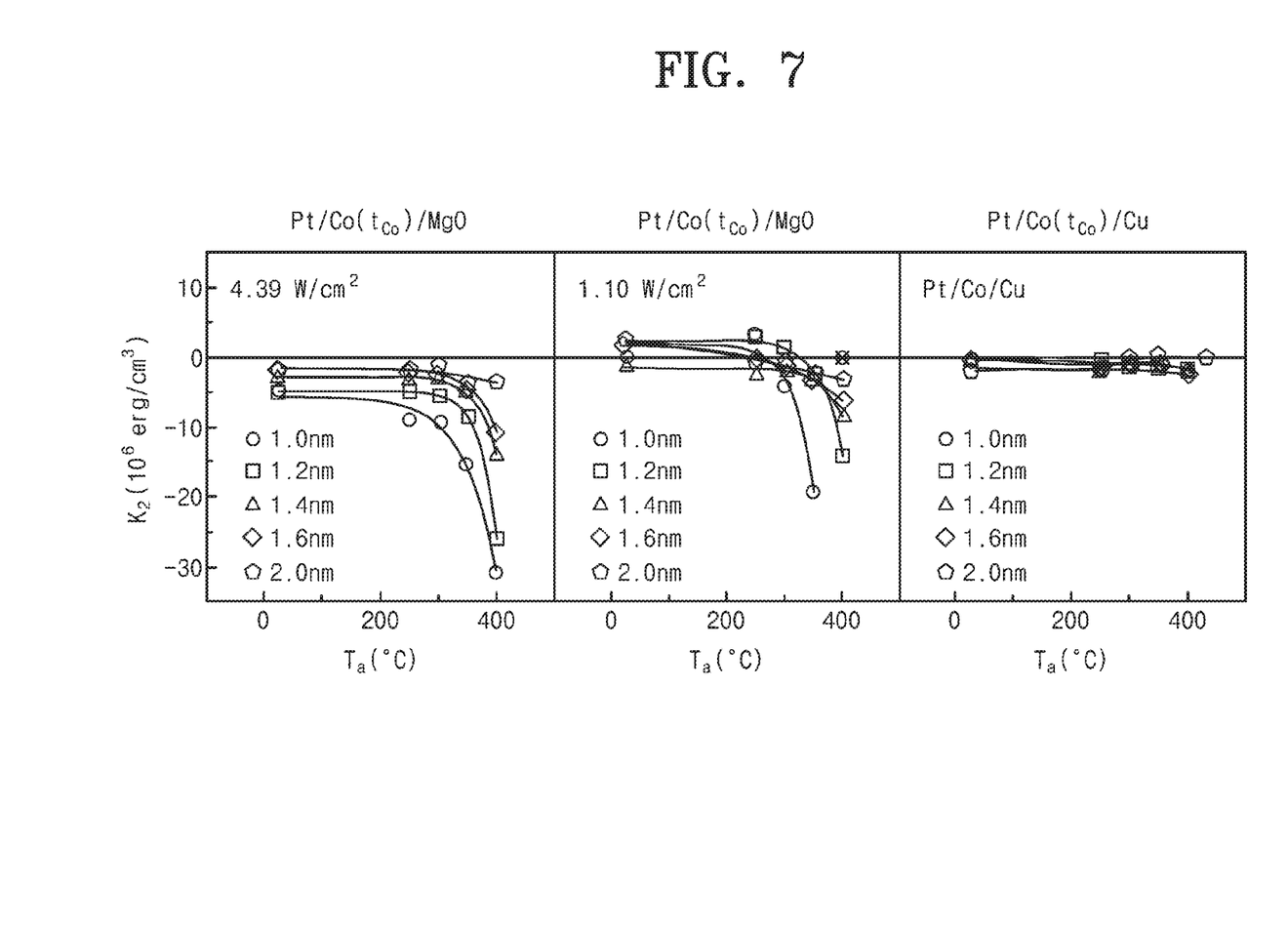
FIG. 7 illustrates a result indicating a second-order perpendicular magnetic anisotropy constant depending on RF sputtering power and post-annealing of a tunnel insulating layer according to an example embodiment of the present disclosure.

FIG. 7 illustrates a result indicating a second-order perpendicular magnetic anisotropy constant depending on RF sputtering power and post-annealing of a tunnel insulating layer according to an example embodiment of the present disclosure.

Referring to FIG. 7, when RF sputtering power of a MgO tunnel insulating layer is 4.39 W/cm², negative $K_2$ values are exhibited at all post-annealing temperatures (20° C. to 400° C.).

However, when the RF sputtering power of the MgO tunnel insulating layer is 1.10 W/cm², $K_2$ shows a positive value or a negative value according to the post-annealing temperature.

In the case of a sample having a Pt—Co—Cu structure, the $K_2$ value is smaller than those of the other samples and is proximate to zero (0) at all annealing temperatures. A lower interface of Pt—Co or an upper interface of Co—MgO is interpreted to be affected during a deposition process of a MgO layer.

Regardless of the RF sputtering power of MgO, as the annealing temperature is increased, $K_2$ is increased to have a negative value. Such a characteristic is interpreted as a structural variation of the Co—MgO interface depending on the annealing temperature.

When the RF sputtering power of MgO is increased or the annealing temperature is increased, a characteristic, in which $K_2$ has a negative value, may be obtained.

In order for the free-magnetic layer 140 to be maintained in an easy-cone state, the free magnetic layer 140 has a positive first-order perpendicular magnetic anisotropy constant $K_{1eff}$ and a negative second-order perpendicular magnetic anisotropy constant $K_2$. In particular, the second-order perpendicular magnetic anisotropy constant $K_2$ of the free magnetic layer 140 should satisfy $K_2 < -\frac{1}{2} K_{1eff}$.

Assuming that PMA results from an interfacial effect, the first-order perpendicular magnetic anisotropy constant is in competition with the first order perpendicular magnetic anisotropy energy and demagnetization energy. Therefore, the first-order perpendicular magnetic anisotropy constant is inversely proportional to a thickness of a magnetic thin film. Therefore, when the thickness of the magnetic thin film is reduced, a positive first-order perpendicular magnetic anisotropy constant $K_{1eff}$ may be obtained. Preferably, the thickness of the magnetic thin film may be 1.6 nm or less.

On the other hand, the second-order perpendicular magnetic anisotropy constant may depend on a spatial distribution of the first-order perpendicular magnetic anisotropy energy in a thin film. Sputtering power of a tunnel insulating layer may be controlled or a post-annealing temperature may be controlled in such that the second-order perpendicular magnetic anisotropy constant $K_2$ satisfies $K_2 < -\frac{1}{2} K_{1eff}$ and has a negative value.

Figure 8:
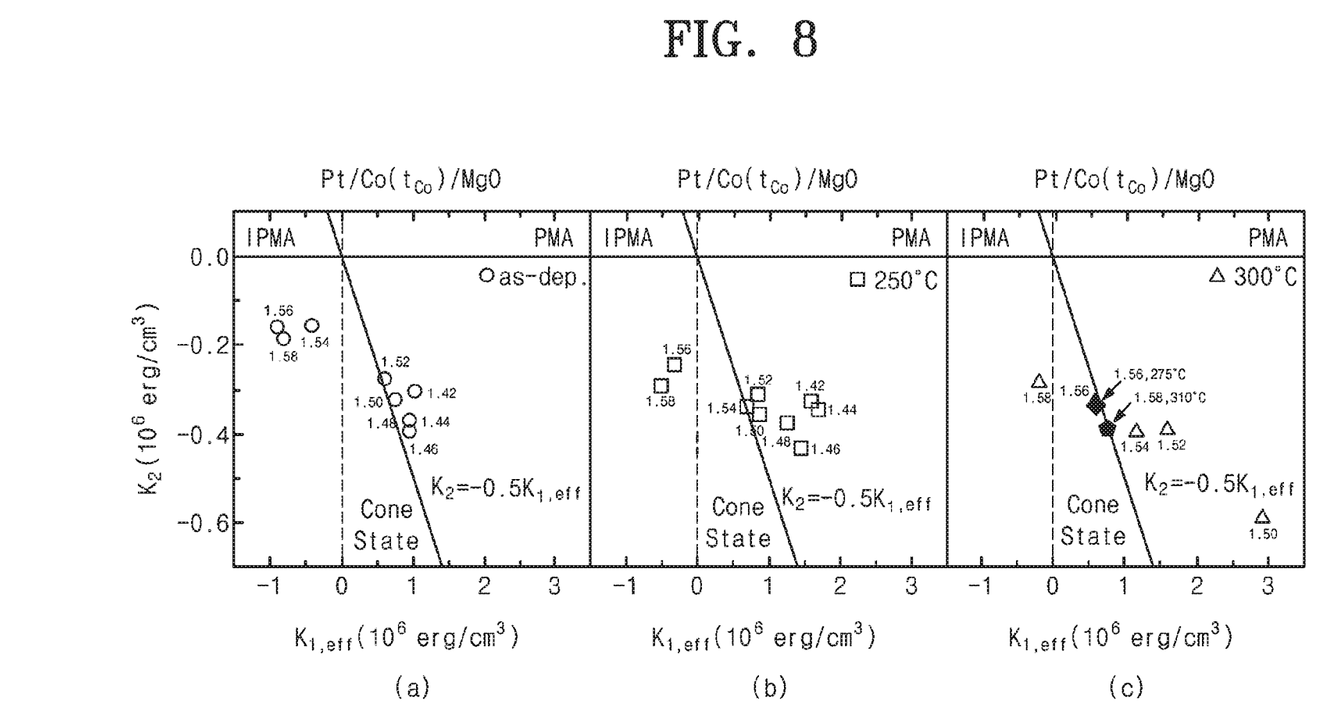
FIG. 8 is a phase diagram shown as a first-order perpendicular magnetic anisotropy constant and a second-order perpendicular magnetic anisotropy constant according to an example embodiment of the present disclosure.

FIG. 8 is a phase diagram shown as a first-order perpendicular magnetic anisotropy constant and a second-order perpendicular magnetic anisotropy constant according to an example embodiment of the present disclosure.

Referring to FIG. 8, when sputtering power of a MgO tunnel insulating layer is 4.39 W/cm², a phase diagram is shown with coordinates of the first-order perpendicular magnetic anisotropy constant $K_{1eff}$ and the second-order perpendicular magnetic anisotropy constant $K_2$. In the case of a deposition state without performing annealing and an annealing temperature of 250° C. (a), a thickness of a cobalt magnetic layer in an easy-to-cone state is not found.

However, when the annealing temperature is 300° C. (c), an easy-cone state is found when the thickness of the cobalt magnetic layer is 1.56 nm.

In the case in which the annealing temperature is 310° C., an easy-cone state is found when the thickness of the cobalt magnetic layer is 1.58 nm. In the case in which the annealing temperature is 275° C., an easy-cone state is found when the thickness of the cobalt magnetic layer is 1.56 nm.

Accordingly, for the magnetic layer in the easy-cone state, the free magnetic layer may have the thickness of 1.56 nm to 1.58 nm and the annealing temperature may be about 275° C. to about 400° C. Since an absolute value of the second-order perpendicular magnetic anisotropy constant $K_2$ increases as the annealing temperature increases, an easy-cone state may be obtained by selecting a thickness of the free-magnetic layer and increasing the annealing temperature.

Figure 9:
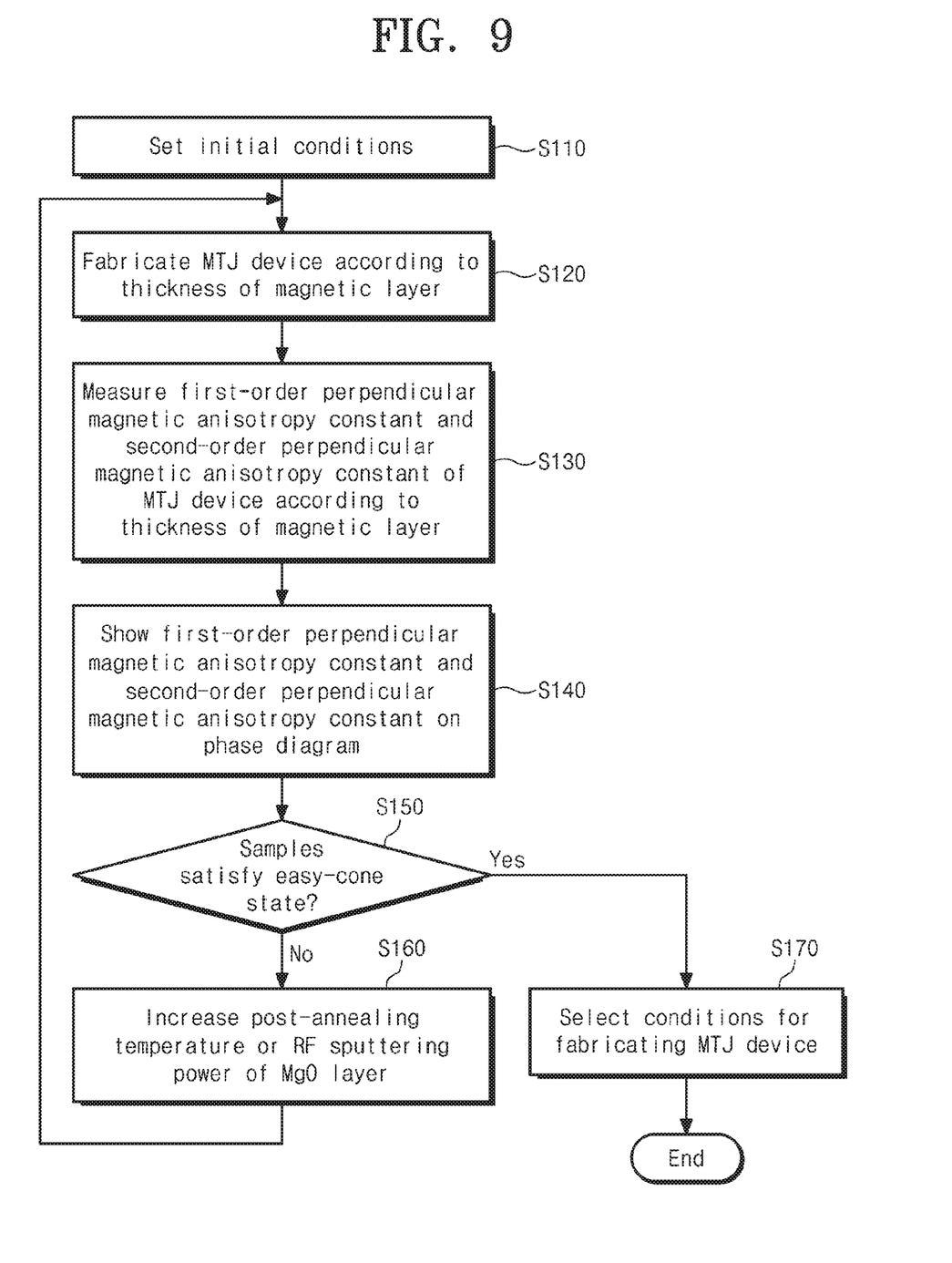
FIG. 9 is a flowchart illustrating a method of fabricating a magnetic tunnel junction device according to an example embodiment of the present disclosure.

FIG. 9 is a flowchart illustrating a method of fabricating a magnetic tunnel junction device according to an example embodiment of the present disclosure.

Referring to FIG. 9, a magnetic tunnel junction device may include a heavy metal layer, a free magnetic layer disposed on the heavy metal layer, and a tunnel insulating layer disposed on the free magnetic layer.

Initial conditions are set to manufacture the magnetic tunnel junction device (S110). The initial conditions may include a post-annealing temperature and sputtering power of the tunnel insulating layer. Also the initial conditions may include thicknesses and materials of the heavy metal layer, the free magnetic layer, and the tunnel insulating layer.

The seed layer, the heavy metal layer, and the free magnetic layer are sequentially deposited using DC sputtering, and a tunnel insulating layer is deposited on the free magnetic layer using RF sputtering to prepare a plurality of sample according to the thickness of the free magnetic layer (S120).

A first-order perpendicular magnetic anisotropy constant and a second-order perpendicular magnetic anisotropy constant of each of the sample are measured according to the thickness of the free magnetic layer (S130). It is confirmed whether the samples satisfy an easy-cone state (S150).

When the samples do not satisfy the easy-cone state, a post-annealing temperature is increased or RF sputtering power of the tunnel insulating layer is increased to prepare samples again (S160).

When the samples satisfy the easy-cone state, the thickness of the free magnetic layer, the post-annealing temperature, and the RF sputtering power satisfying the conditions are selected to fabricate a magnetic tunnel junction device (S170).

An ultimate selected post-annealing temperature may range from 275° C. to 400° C. RF sputtering power for depositing the tunnel insulating layer may be 1.10 W/cm² or more. The thickness of the free magnetic layer may range from 1.4 nm to 1.8 nm. The magnetic tunnel junction device may have a Pt (5 nm)-Co ($t_{Co}$)—MgO (2 nm) structure.

Figure 10:
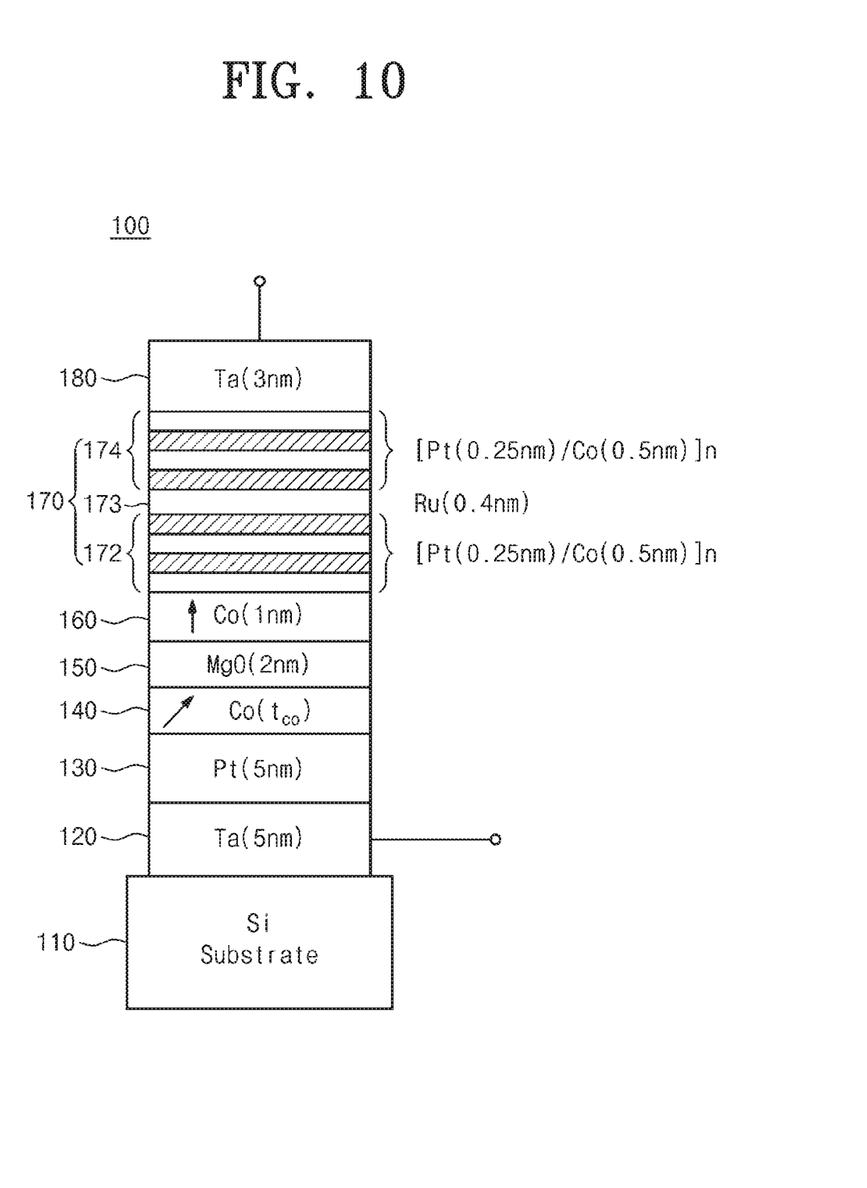
FIG. 10 is a cross-sectional view of a magnetic tunnel junction device according to an example embodiment of the present disclosure.

FIG. 10 is a cross-sectional view of a magnetic tunnel junction device according to an example embodiment of the present disclosure.

Referring to FIG. 10, a magnetic tunnel junction device 100 may include a heavy metal layer 130, a free magnetic layer 140 disposed on the heavy metal layer 130, and a tunnel insulating layer 150 disposed on the free magnetic layer 140. The magnetic tunnel junction device 100 may constitute a spin-torque transfer magnetic random access memory (STT-MRAM). The heavy metal layer 130 may include platinum (Pt), the free magnetic layer 140 may include cobalt (Co), a magnetization state of the free magnetic layer 140 may have an easy-cone state, and the free magnetic layer 140 has a positive first-order perpendicular magnetic anisotropy constant and a negative second-order perpendicular magnetic anisotropy constant. The tunnel insulating layer 150 may include magnesium oxide (MgO).

The free magnetic layer 140 may have a thickness of 1.4 nm to 1.8 nm. A magnetization of the free magnetic layer 140 may be aligned in an in-plane direction at the same time as deposition, and a magnetization of the free magnetic layer 140 may be aligned in an easy-cone state by annealing.

A seed layer 120 may be disposed below the heavy metal layer 130 and may include tantalum (Ta) (5 nm). A substrate 110 may be disposed below the seed layer 120. The substrate 110 may be a silicon substrate.

The tunnel insulating layer 150 may include MgO (2 nm), and the tunnel insulating layer may be formed using RF sputtering.

A pinned magnetic layer 160 may be disposed on the tunnel insulating layer 150. The pinned magnetic layer 160 may exhibit a perpendicular magnetization state having perpendicular magnetic anisotropy. A material of the pinned magnetic layer 160 may be cobalt (Co), iron (Fe), nickel (Ni), or alloys containing at least one thereof. Specifically, the pinned magnetic layer 160 may include cobalt iron boron (CoFeB).

A synthetic antiferromagnetic layer (SAF) 170 may be disposed on the pinned magnetic layer 160. The synthetic antiferromagnetic layer 170 may fix the magnetization direction of the pinned magnetic layer 160. The anisotropic antiferromagnetic layer 170 may include a bottom multilayer thin film 172 of [Pt/Co]n, a ruthenium (Ru) conductive spacer layer 173, and a top multilayer thin film 174 of [Pt/Co]n.

A protective layer 180 may be disposed on the synthetic antiferromagnetic layer 170. The protective layer 180 may include tantalum (Ta).

Figure 11:
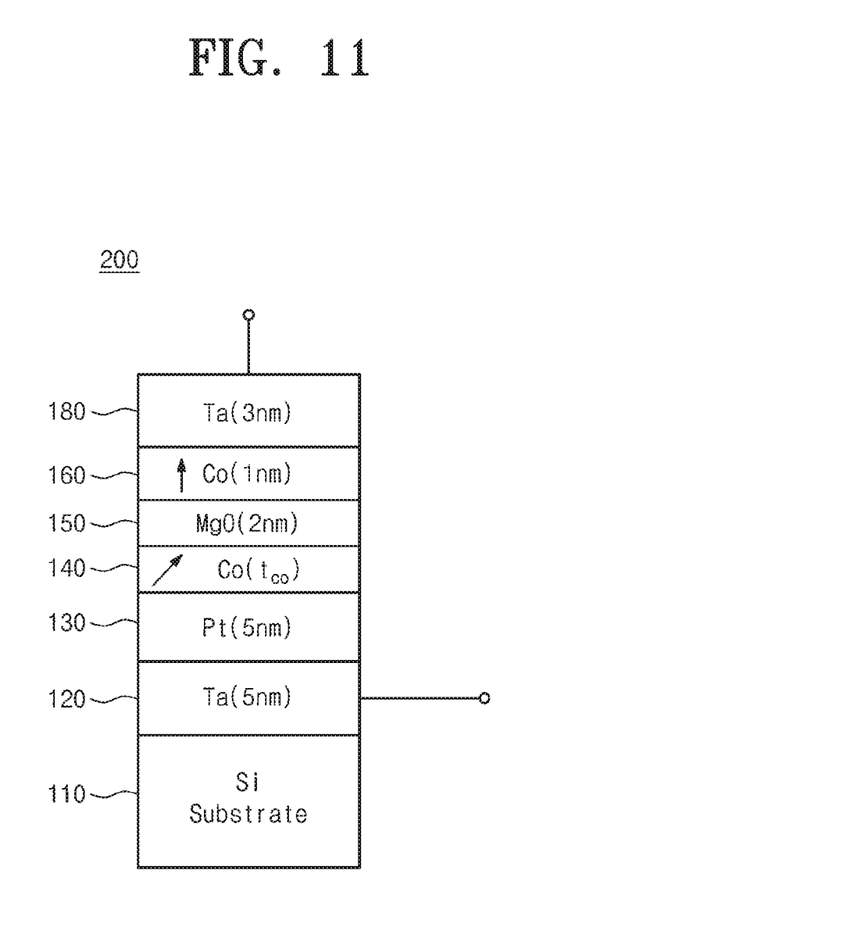
FIG. 11 is a cross-sectional view of a magnetic tunnel junction device according to an example embodiment of the present disclosure.

FIG. 11 is a cross-sectional view of a magnetic tunnel junction device according to an example embodiment of the present disclosure.

Referring to FIG. 11, a magnetic tunnel junction device 200 may include a heavy metal layer 130, a free magnetic layer 140 disposed on the heavy metal layer 130, and a tunnel insulating layer 150 disposed on the free magnetic layer 140. The magnetic tunnel junction device 200 may constitute a spin-torque oscillator (STO).

The heavy metal layer 130 may include platinum (Pt), the free magnetic layer 140 may include cobalt (Co), and a magnetization state of the free magnetic layer 140 may have an easy-cone state. The free magnetic layer 140 has a positive first-order perpendicular magnetic anisotropy constant and a negative second-order perpendicular magnetic anisotropy constant, and the tunnel insulating layer 150 may include magnetic oxide (MgO).

The free magnetic layer has a thickness of 1.4 nm to 1.8 nm. A magnetization of the free magnetic layer is aligned in an in-plane direction at the same time as the deposition, and may be aligned in an easy-cone state by annealing.

A seed layer 120 may be disposed below the heavy metal layer 130, and the seed layer may include tantalum (Ta) (5 nm). A substrate 110 may be disposed below the seed layer 120. The substrate may be a silicon substrate.

The tunnel insulating layer 150 may include MgO (2 nm) and may be formed using RF sputtering.

A pinned magnetic layer 160 may be disposed on the tunnel insulating layer 150. The pinned magnetic layer 160 may exhibit a perpendicular magnetization state having perpendicular magnetic anisotropy. A material of the pinned magnetic layer 160 may be cobalt (Co), iron (Fe), nickel (Ni), or alloys containing at least one thereof. Specifically, the pinned magnetic layer 160 may include cobalt (Co) or cobalt iron boron (CoFeB).

A protective layer 180 may be disposed on the pinned magnetic layer 160. The protective layer may include tantalum (Ta).

Unlike a case in which the free magnetic layer 140 has perpendicular magnetic anisotropy, the free magnetic layer 140 in an easy-cone state may perform microwave oscillation without an external magnetic field. In the case of the easy-cone state, the free magnetic layer 140 has a specific polar angle $\theta_E$, and thus an effective anisotropy field $H_{eff}$ has a value of zero at the equilibrium angle ($\theta_{eq}=\theta_E$). As a spin torque is transferred to the magnetization, the effective anisotropy field $H_{eff}$ becomes non-zero, resulting in a microwave oscillation of the magnetization.

According to an example embodiment, when an insulating layer is deposited on a magnetic layer by a sputtering method, the magnetic layer under below the insulating layer is inevitably oxidized. Considering that the magnetic layer has a thickness of only a few nanometers, the sputtering deposition of the insulating layer may a fatal disadvantage to cause deterioration of PMA characteristics.

According to an example embodiment, PMA characteristics occurring at a boundary between a heavy metal layer and a magnetic layer or between a magnetic layer and am insulating layer may be controlled by adjusting sputtering power of the insulating layer, post-annealing, or a thickness of the magnetic layer.

According to an example embodiment, thermal stability characteristics may be significantly improved by adjusting sputtering power of an insulating layer, a post-annealing temperature, a thickness of a magnetic layer, or the like. Alternatively, a speed of magnetization reversal caused by a spin torque may be significantly improved by forming a magnetic layer having an easy-cone state.

Although the present disclosure and its advantages have been described in detail, it should be understood that various changes, substitutions and alterations can be made herein without departing from the spirit and scope of the disclosure as defined by the following claims.

What is claimed is:

1. A magnetic tunnel junction device comprising:
    a substrate;
    a seed layer directly disposed on the substrate;
    a metal layer consisting of platinum (Pt) directly disposed on the seed layer;
    a free magnetic layer comprising cobalt (Co) directly disposed on the metal layer;
    a tunnel insulating layer directly disposed on the free magnetic layer; and
    a protective layer directly disposed on the tunnel insulating layer,
    wherein the free magnetic layer has a thickness of 1.4 nanometers to 1.8 nanometers,
    wherein the free magnetic layer has a positive first-order perpendicular magnetic anisotropy constant ($K_{1eff}$) and a negative second-order perpendicular magnetic anisotropy constant ($K_2$), and
    wherein the positive first-order perpendicular magnetic anisotropy constant ($K_{1eff}$) and the negative second-order perpendicular magnetic anisotropy constant ($K_2$) satisfy the equation of $K_2 < -\frac{1}{2} K_{1eff}$.

2. The magnetic tunnel junction device as set forth in claim 1, wherein the seed layer comprises tantalum (Ta).

3. The magnetic tunnel junction device as set forth in claim 1, further comprising a pinned magnetic layer disposed on the tunnel insulating layer.

4. The magnetic tunnel junction device as set forth in claim 3, wherein the pinned magnetic layer comprises cobalt (Co), iron (Fe), nickel (Ni), or alloy thereof.

5. The magnetic tunnel junction device as set forth in claim 1, wherein a magnetization direction of the free magnetic layer has a direction between an in-plane direction and an out-of-plane direction.

6. The magnetic tunnel junction device as set forth in claim 1, wherein a thickness of the metal layer is about 5 nm.

\* \* \* \* \*